(12) United States Patent
Jeong

(10) Patent No.: US 7,268,050 B2
(45) Date of Patent: Sep. 11, 2007

(54) METHOD FOR FABRICATING A MOS TRANSISTOR IN A SEMICONDUCTOR DEVICE INCLUDING ANNEALING IN A NITROGEN ENVIRONMENT TO FORM A NITRIDED OXIDE FILM

(75) Inventor: Min Ho Jeong, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 301 days.

(21) Appl. No.: 11/025,696

(22) Filed: Dec. 28, 2004

(65) Prior Publication Data

US 2005/0153500 A1    Jul. 14, 2005

(30) Foreign Application Priority Data

Dec. 31, 2003   (KR)   ...................... 10-2003-0101124

(51) Int. Cl.
   *H01L 21/336*   (2006.01)

(52) U.S. Cl. ....................... 438/305; 438/775; 438/786
(58) Field of Classification Search ................. 438/775
   See application file for complete search history.

(56) References Cited

U.S. PATENT DOCUMENTS 6,191,052 B1 * 2/2001 Wang .......................... 438/775
6,534,388 B1 * 3/2003 Lin et al. ..................... 438/510
6,767,847 B1 * 7/2004 Hu et al. ..................... 438/771

OTHER PUBLICATIONS

Stanley Wolf and Richard N. Tauber, "Silicon Processing for the VLSI Era—vol. 1: Process Technology," Lattice Press, Sunset Beach, California, 1986, pp. 198, 539, 551-555.*

* cited by examiner

*Primary Examiner*—Stephen W. Smoot
(74) *Attorney, Agent, or Firm*—Andrew D. Fortney

(57) ABSTRACT

A method for fabricating a MOS transistor in a semiconductor device is disclosed. An example method subjects a surface of a semiconductor substrate to thermal oxidation to form an oxide film for forming a gate insulating film, deposits a polysilicon layer on the oxide film for forming a gate, applies a coat of photoresist onto the polysilicon layer, and performs exposure and development by using an exposure mask which defines the gate to form a photoresist pattern covering a region where the gate is to be formed. The example method also performs dry etching to remove the polysilicon layer for forming the gate and the oxide film for forming the gate insulating film, which are not protected with the photoresist pattern, to form a gate pattern, performs annealing under a nitrogen environment to form a nitrided oxide film, and forms buried lightly doped impurity ion layers on opposite sides of the gate pattern. Additionally, the example method deposits an insulating layer on the substrate to cover the gate pattern and etches back the insulating layer to expose the surface of the semiconductor substrate to form sidewall spacers, forms buried heavily doped impurity ion layers in the semiconductor substrate at exposed active regions by using the gate pattern and the sidewall spacers as an ion injection mask, and performs annealing to diffuse impurity ions for forming source/drain junctions to form lightly doped impurity diffusion regions and heavily doped impurity diffusion regions.

20 Claims, 4 Drawing Sheets

METHOD FOR FABRICATING A MOS TRANSISTOR IN A SEMICONDUCTOR DEVICE INCLUDING ANNEALING IN A NITROGEN ENVIRONMENT TO FORM A NITRIDED OXIDE FILM

RELATED APPLICATION

This application claims the benefit of Korean Application No. P2003-0101124 filed on Dec. 31, 2003, which is hereby incorporated by reference in its entirety.

TECHNICAL FIELD

The present disclosure relates to a semiconductor device, and more particularly, to a method for fabricating a MOS transistor in a semiconductor device.

BACKGROUND

As semiconductor device packing densities become higher, cells in the semiconductor device become smaller to increase an internal field intensity. The increased field intensity accelerates carriers in a depletion layer in the vicinity of a drain during operation of the device to cause a hot carrier effect in which the carriers are injected from a channel region to a gate oxide film. The carriers injected in the gate oxide film form a potential at an interface of a semiconductor substrate and the gate oxide film, leading to change a threshold voltage (VTH) or drop a mutual conductance, which makes device characteristics poor. Therefore, to prevent the device characteristics from becoming poor due to the hot carrier effect, it is required to change a drain structure, like an LDD (Lightly Doped Drain).

FIGS. 1A~1C illustrate sections showing a known method for fabricating a MOS transistor of a typical LDD structure in a semiconductor device. Referring to FIG. 1A, a field oxide film (not shown), an active cell isolation film, is formed on a surface of a P-type semiconductor substrate 100 of silicon or the like by LOCOS (Local Oxidation of Silicon) or STI (Shallow Trench Isolation) for defining an active region and field region of cells.

A portion of the substrate at the active region is removed by photolithography to form a trench where a gate is to be formed. Then, ions are injected into an entire exposed surface of the substrate for adjusting a threshold voltage. A surface of the semiconductor substrate 100 inclusive of the trench is subjected to thermal oxidation to form an oxide film 102 for forming a gate insulating film. Then, a polysilicon layer 104 is deposited on the field oxide film and the oxide film 102 by Chemical Vapor Deposition (CVD) for forming a gate. In this instance, in deposition of the polysilicon layer 104, doped silicon may be used, or undoped silicon may be used, when the polysilicon layer 104 is doped by ion injection or the like, to make the polysilicon layer conductive.

Referring to FIG. 1B, a coat of photoresist is applied onto the polysilicon layer 104, and subjected to exposure and development with a mask that defines the gate to form a photoresist pattern (not shown) covering a region where the gate is to be formed. Then, the polysilicon layer for forming the gate, and the oxide film for forming the gate insulating film, which are not protected with the photoresist pattern, are removed by anisotropic etching, such as dry etching, to form a gate pattern 104. Because the gate pattern 104 is in the trench, an effective channel length of a transistor to be formed later increases. Additionally, because the gate pattern 104 has a topography partially projected from the surface of the substrate, a height difference of step from neighboring portions can be improved.

Then, N-type impurity ions are injected into the substrate 100 at an exposed active region by using the gate pattern 104 as an ion injection mask to form lightly doped impurity ion buried layers on opposite sides of the gate pattern. The lightly doped impurity ion buried layers form lightly doped impurity diffusion regions 106 of LDD structures.

Referring to FIG. 1C, an insulating layer, such as an oxide silicon film or a nitride film, is deposited on the substrate to cover the gate pattern 104, and etched back to expose the surface of the semiconductor substrate 100, to form sidewall spacers 108. The sidewall spacers 108 insulates the gate 104 from surroundings, and is used as an ion injection mask for forming heavily doped impurity diffusion regions 110 of the source/drain.

N-type impurity ions are injected into the semiconductor substrate at an exposed active region by using the gate pattern 104 and the sidewall spacers 108 as an ion injection mask to form buried heavily doped impurity diffusion regions used as source/drain regions. In this instance, most of the buried heavily doped impurity diffusion regions respectively overlap with the buried lightly doped impurity diffusion regions, except portions under the sidewall spacers 108 where only the buried lightly doped impurity diffusion regions exist.

Then, the substrate 100 having the buried heavily doped impurity diffusion regions and the buried lightly doped impurity diffusion regions formed therein are subjected to heat treatment, such as annealing, to diffuse the impurity ions for forming source/drain junctions, to form the lightly doped impurity diffusion regions 106 and the heavily doped impurity diffusion regions 110. In this instance, because the annealing is performed at an elevated temperature, the impurities can be diffused from the gate 104 and the source/drain regions 110 outwardly to increase a resistance.

DETAILED DESCRIPTION

The examples described herein provide a method for fabricating a MOS transistor in a semiconductor device, which can prevent impurities from diffusing outwardly, which is liable to occur during annealing, to prevent a resistance from increasing at a gate and source/drain regions.

More specifically, an example method for fabricating a MOS transistor in a semiconductor device includes subjecting a surface of a semiconductor substrate to thermal oxidation to form an oxide film for forming a gate insulating film, depositing a polysilicon layer on the oxide film for forming a gate, applying a coat of photoresist onto the polysilicon layer, and performing exposure and development by using an exposure mask that defines the gate, to form a photoresist pattern covering a region where the gate is to be formed. The example method also performs dry etching to remove the polysilicon layer for forming the gate, and the oxide film for forming the gate insulating film, which are not protected with the photoresist pattern, to form a gate pattern, performs annealing under a nitrogen environment to form a nitrided oxide film, and forms buried lightly doped impurity ion layers on opposite sides of the gate pattern. In addition, the example method may deposit an insulating layer on the substrate to cover the gate pattern and etch back the insulating layer to expose the surface of the semiconductor substrate to form sidewall spacers, form buried heavily doped impurity ion layers in the semiconductor substrate at exposed active regions by using the gate pattern and the sidewall spacers as an ion injection mask, and perform annealing to diffuse impurity ions for forming source/drain junctions to form lightly doped impurity diffusion regions and heavily doped impurity diffusion regions.

Figure 1A:
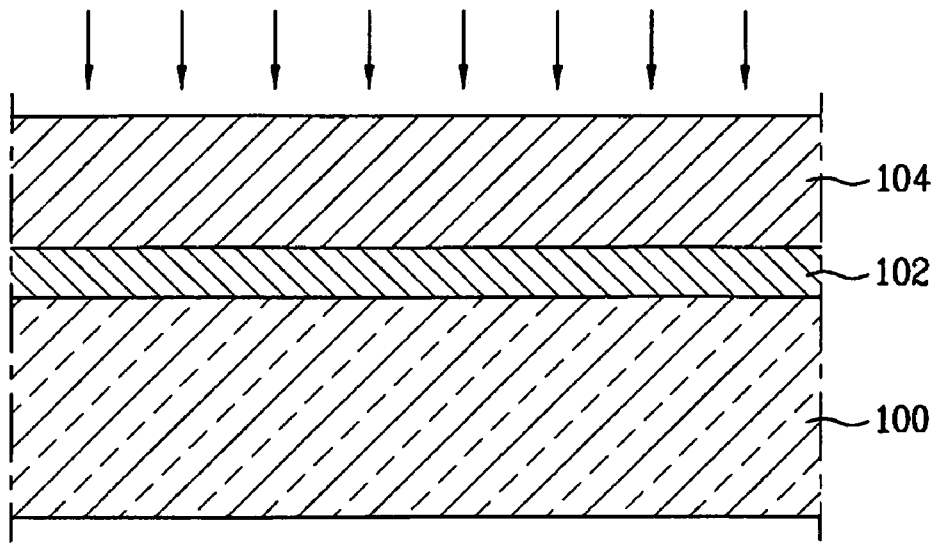
FIGS. 1A~1C illustrate sections depicting a known method for fabricating a MOS transistor of a typical LDD structure in a semiconductor device.
Figure 1B:
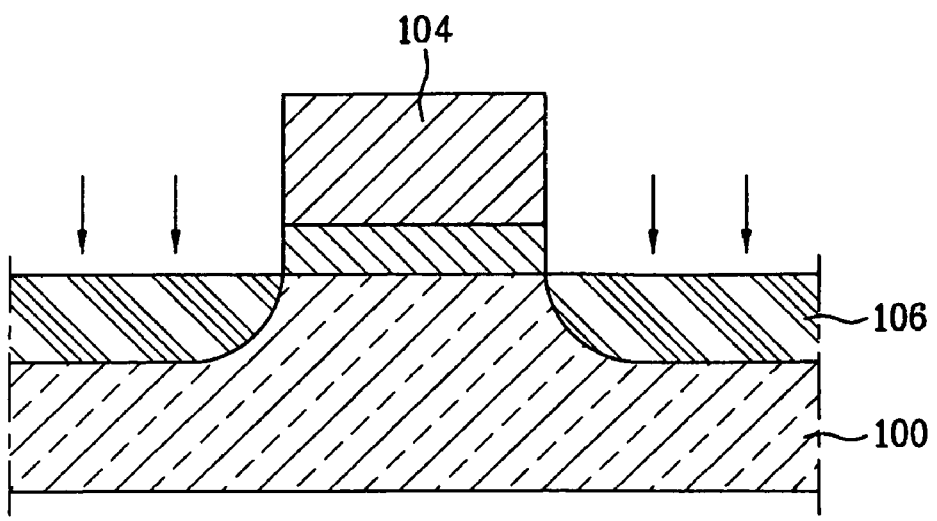
Figure 1C:
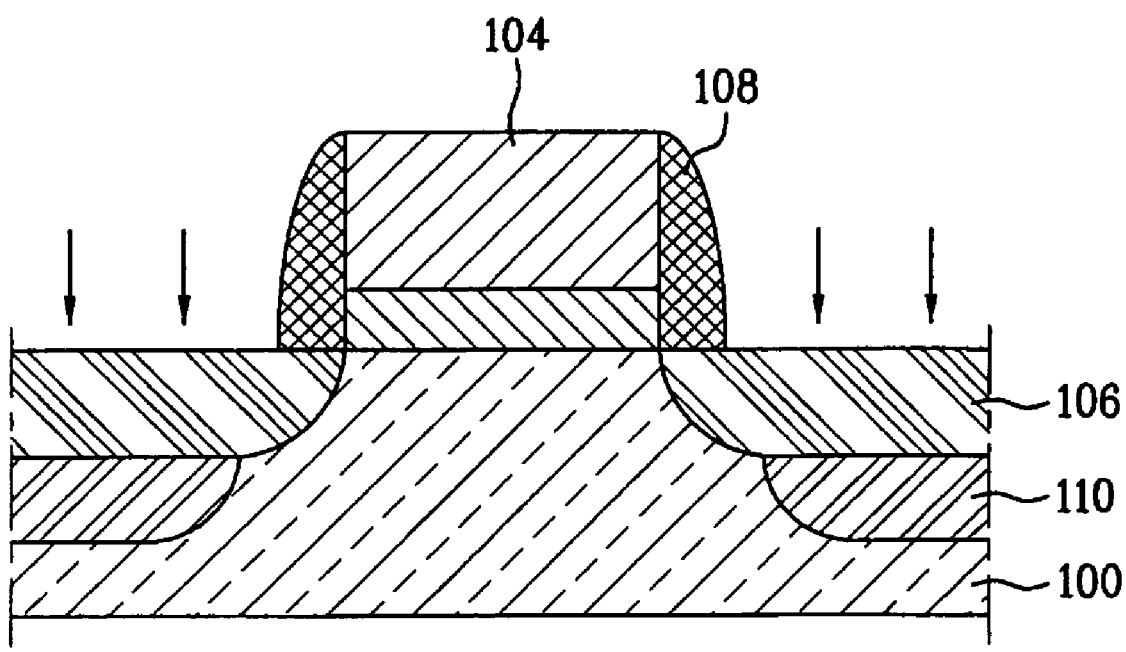
Figure 2A:
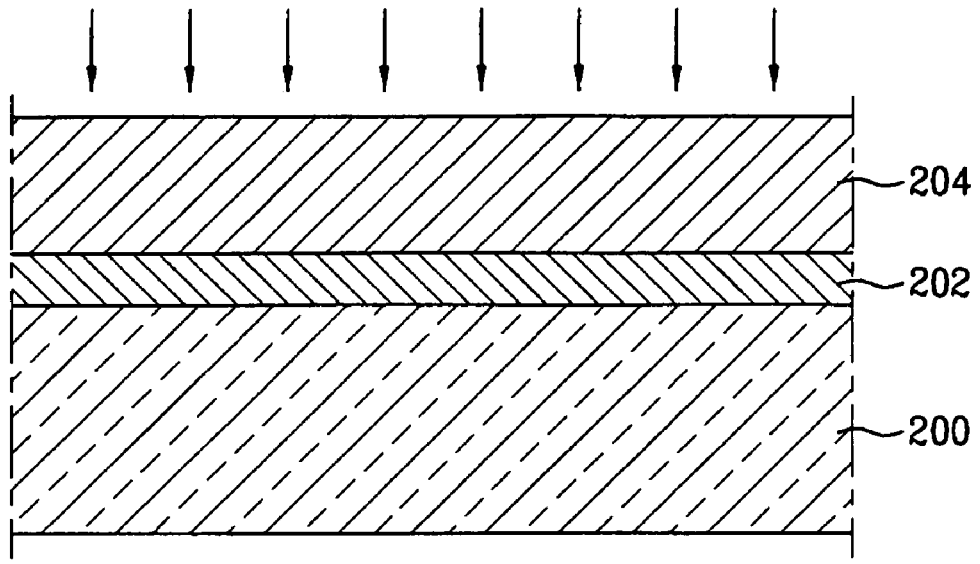
FIGS. 2A~2D illustrate sections of an example method for fabricating a MOS transistor of a typical LDD structure in a semiconductor device.

FIGS. 2A~2D illustrate sections depicting operations of an example method for fabricating a MOS transistor of a typical LDD structure in a semiconductor device. Referring to FIG. 2A, a field oxide film (not shown), an active cell isolation film, is formed on a surface of a P-type semiconductor substrate 200 of silicon or the like by LOCOS (Local Oxidation of Silicon) or STI (Shallow Trench Isolation) for defining an active region and field region of cells. A portion of the substrate at the active region is removed by photolithography to form a trench where a gate is to be formed. Then, ions are injected into an entire exposed surface of the substrate for adjusting a threshold voltage.

A surface of the semiconductor substrate 200 inclusive of the trench is subjected to thermal oxidation to form an oxide film 202 for forming a gate insulating film. Then, a polysilicon layer 204 is deposited on the field oxide film and the oxide film 202 by Chemical Vapor Deposition (CVD) for forming a gate. In this instance, in deposition of the polysilicon layer 204, doped silicon may be used, or undoped silicon may be used, when the polysilicon layer 204 is doped by ion injection or the like, to make the polysilicon layer conductive.

Figure 2B:
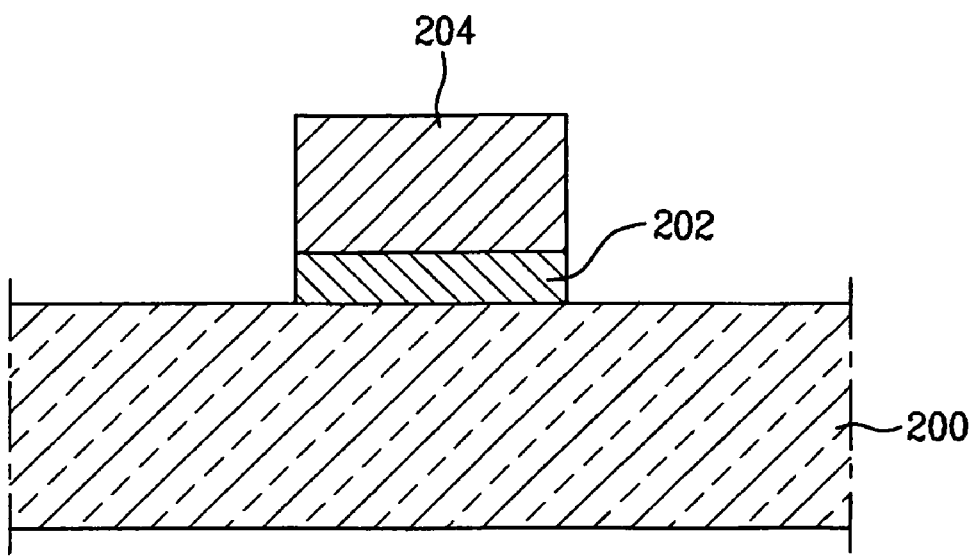

Referring to FIG. 2B, a coat of photoresist is applied to the polysilicon layer 204 and subjected to exposure and development with a mask that defines the gate to form a photoresist pattern (not shown) covering a region where the gate is to be formed.

Then, the polysilicon layer for forming the gate and the oxide film for forming the gate insulating film, which are not protected with the photoresist pattern, are removed by anisotropic etching, such as dry etching, to form a gate pattern 204. Because the gate pattern 204 is in the trench, an effective channel length of a transistor to be formed later increases. Also, because the gate pattern 204 has a topography partially projected from the surface of the substrate, a height difference of a step from neighboring portions can be improved.

Figure 2C:
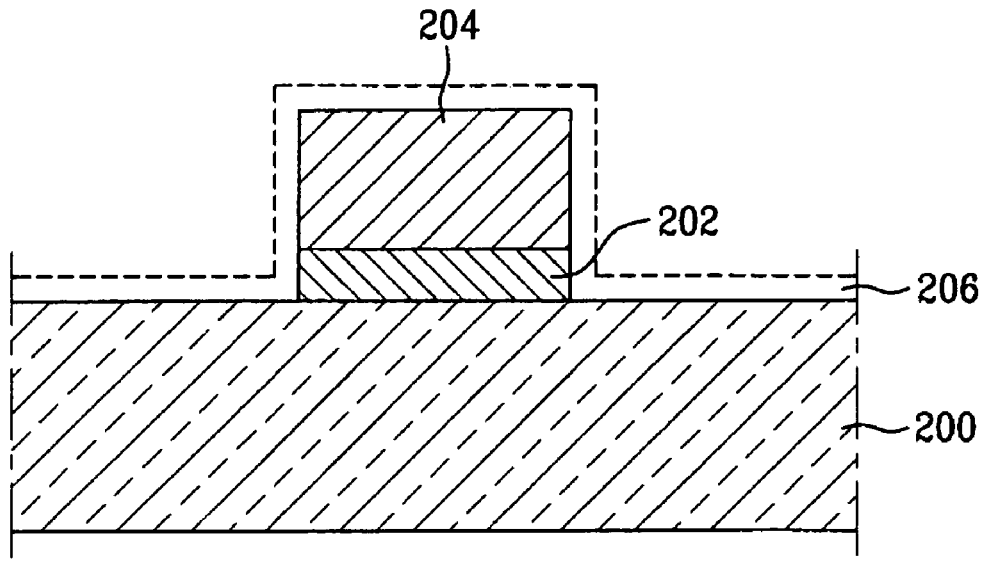

Referring to FIG. 2C, an in-situ annealing process is performed under a nitrogen environment by using NO or $N_2O$ gas, to form a nitrided oxide film 206. The annealing process is performed at a temperature 850° C. or higher for activating impurity in the polysilicon layer 204 and adequate saturation of the oxide film 202 with nitrogen.

Figure 2D:
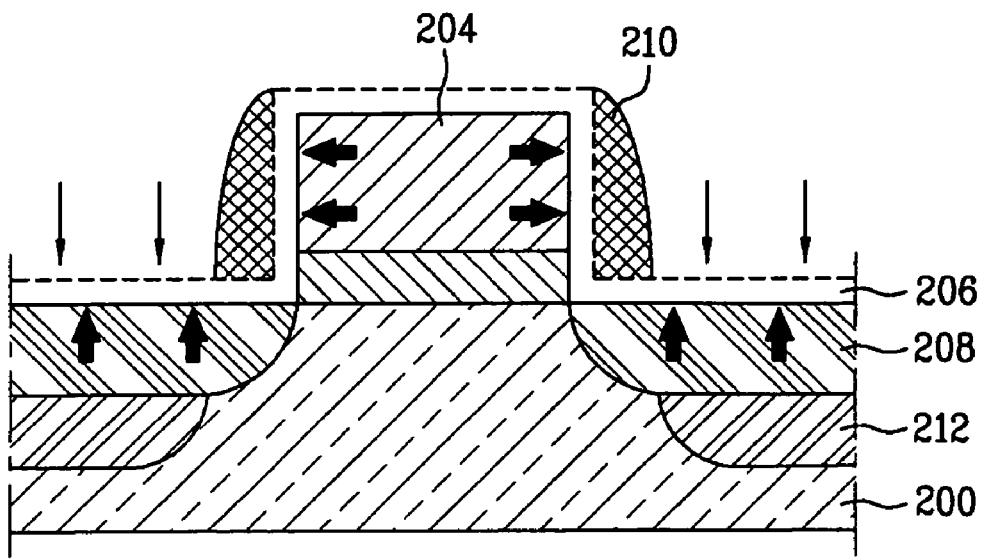

Referring to FIG. 2D, N-type impurity ions are injected into the substrate 200 at an exposed active region by using the gate pattern 204 as an ion injection mask to form lightly doped impurity ion buried layers on opposite sides of the gate pattern. The lightly doped impurity ion buried layers are formed for forming lightly doped impurity diffusion regions 208 of LDD structures.

Then, an insulating layer, such as an oxide silicon film or a nitride film, is deposited on the substrate to cover the gate pattern 204 and etched back to expose the surface of the semiconductor substrate 200 to form sidewall spacers 210.

The sidewall spacers 210 insulate the gate 204 from surroundings and are used as an ion injection mask for forming heavily doped impurity diffusion regions 212 of the source/drain.

N-type impurity ions are injected into the semiconductor substrate 200 at an exposed active region by using the gate pattern 204 and the sidewall spacers 210 as an ion injection mask to form buried heavily doped impurity diffusion regions used as source/drain regions. In this instance, most of the buried heavily doped impurity diffusion regions respectively overlap with the buried lightly doped impurity diffusion regions, except portions under the sidewall spacers 210 where only the buried lightly doped impurity diffusion regions exist.

Then, the substrate 200 having the buried heavily doped impurity diffusion regions and the buried lightly doped impurity diffusion regions formed therein are subjected to heat treatment, such as annealing, to diffuse the impurity ions for forming source/drain junctions, to form the lightly doped impurity diffusion regions 208 and the heavily doped impurity diffusion regions 212. The nitrided oxide film 206 prevents the impurity from diffusing outwardly.

In the example method described herein, the nitrided oxide film formed by an elevated temperature annealing under a nitrogen environment during formation of the polysilicon layer after etching the gate prevents the impurity from diffusing outwardly, which is liable to occur in a following annealing, to prevent consequential increase of resistance at the gate and source/drain regions. As has been described, the prevention of outward diffusion of the impurity which is liable to occur during an elevated temperature annealing enhances process reliability and total yield.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method for fabricating a MOS transistor in a semiconductor device, comprising:
  subjecting a surface of a semiconductor substrate to thermal oxidation to form an oxide film;
  depositing a polysilicon layer on the oxide film;
  applying a coat of photoresist onto the polysilicon layer, and performing exposure and development using an exposure mask which defines a gate, to form a photoresist pattern covering a region of the polysilicon layer;
  dry etching the portions of the polysilicon layer and portions of the oxide film that are not protected by the photoresist pattern, to form a gate pattern and to expose surfaces of the semiconductor substrate adjacent to the gate pattern;
  annealing the semiconductor substrate in an environment including a nitrogen- and oxygen-containing gas to form a nitrided oxide film over the gate pattern and the exposed surfaces of the semiconductor substrate;
  forming buried lightly doped impurity ion layers on opposite sides of the gate pattern;
  depositing an insulating layer on the nitrided oxide film to cover the gate pattern and etching back the insulating layer to form sidewall spacers;
  forming buried heavily doped impurity ion layers in the semiconductor substrate at exposed active regions using the gate pattern and the sidewall spacers as an ion injection mask; and annealing the semiconductor substrate to diffuse impurity ions and form source/drain junctions and form lightly doped impurity diffusion regions.

2. The method as claimed in claim 1, wherein the nitrogen- and oxygen-containing gas comprises NO or $N_2O$ gas.

3. The method as claimed in claim 1, wherein step of annealing comprises exposing the semiconductor substrate to a temperature of at least 850° C.

4. The method as claimed in claim 1, wherein the step of annealing the semiconductor substrate adds nitrogen to the oxide film.

5. The method as claimed in claim 4, wherein the oxide film becomes saturated with nitrogen during the annealing step.

6. The method as claimed in claim 1, wherein the insulating layer comprises an oxide layer.

7. The method as claimed in claim 1, wherein the insulating layer comprises a nitride layer.

8. The method as claimed in claim 1, wherein forming buried lightly doped impurity ion layers comprises implanting N-type impurity ions using the gate pattern as an ion injection mask.

9. The method as claimed in claim 1, wherein forming buried heavily doped impurity ion layers comprises implanting N-type impurity ions.

10. The method as claimed in claim 1, wherein depositing the polysilicon layer comprises chemical vapor deposition of polysilicon.

11. The method as claimed in claim 1, further comprising implanting ions into the polysilicon layer prior to forming the gate pattern and the gate insulating film.

12. The method as claimed in claim 1, wherein depositing the polysilicon layer comprises chemical vapor deposition of doped polysilicon.

13. The method as claimed in claim 1, further comprising forming isolation layers defining field regions and an active region of the semiconductor substrate prior to forming the oxide film.

14. The method as claimed in claim 13, further comprising removing a portion of the semiconductor substrate in the active region to form a trench.

15. The method as claimed in claim 14, wherein the oxide film and the polysilicon layer are formed in the trench in the active region.

16. The method as claimed in claim 14, wherein removing a portion of the substrate comprises photolithography.

17. The method as claimed in claim 14, wherein the gate pattern protrudes partially above the areas of the semiconductor substrate surrounding the active area.

18. The method as claimed in claim 13, wherein forming isolation layers comprises a LOCOS process or a STI process.

19. The method as claimed in claim 1, wherein etching back the insulating layer comprises exposing surfaces of the nitrided oxide film over the gate pattern and adjacent to the sidewall spacers.

20. The method as claimed in claim 1, wherein the nitrided oxide film blocks outward impurity diffusion during the step of annealing the semiconductor substrate to diffuse impurity ions.

* * * * *